(12) United States Patent
Campbell et al.

(10) Patent No.: US 6,230,069 B1
(45) Date of Patent: May 8, 2001

(54) SYSTEM AND METHOD FOR CONTROLLING THE MANUFACTURE OF DISCRETE PARTS IN SEMICONDUCTOR FABRICATION USING MODEL PREDICTIVE CONTROL

(75) Inventors: William Jarrett Campbell; James Anthony Mullins; Anthony John Toprac, all of Austin, TX (US)

(73) Assignee: Advanced Micro Devices, Inc.

( * ) Notice: Subject to any disclaimer, the term of this patent is extended or adjusted under 35 U.S.C. 154(b) by 0 days.

(21) Appl. No.: 09/105,979

(22) Filed: Jun. 26, 1998

(51) Int. Cl.$^7$ .................................................. G06F 19/00
(52) U.S. Cl. ............................................................ 700/121
(58) Field of Search ................................. 700/95, 96, 117, 700/121

(56) References Cited

U.S. PATENT DOCUMENTS

| | | |
|---|---|---|
| 5,298,110 | 3/1994 | Schoenborn et al. . |
| 5,408,405 | 4/1995 | Mozumder et al. . |
| 5,519,605 | 5/1996 | Cawlfield . |
| 5,526,293 | 6/1996 | Mozumder et al. . |
| 5,609,136 | 3/1997 | Tuken . |
| 5,655,951 | 8/1997 | Meikle et al. . |
| 5,665,199 | 9/1997 | Sahota et al. . |
| 5,695,601 | 12/1997 | Kodera et al. . |
| 5,740,033 | 4/1998 | Wassick et al. . |

FOREIGN PATENT DOCUMENTS 0 643 344 A1    3/1995    (EP) .

OTHER PUBLICATIONS

Boning, D. et al., "Practical Issues in Run by Run Process Control", IEEE/SEMI Advanced Semiconductor Manufacturing Conference, pp. 201–208 (Copyright 1995).

Boning, D.S. et al., "Run by Run Control of Chemical–Mechanical Polishing", IEEE Transactions on Components, Packaging and Manufacturing Technology—Part C., 19(4):307–311 (Oct. 1996).

Butler, S.W. et al., "Supervisory Run–to–Run Control of Polysilicon Gate Etch Using In Situ Ellipsometry", IEEE Transactions on Semiconductor Manufacturing, 7(2):193–201 (May 1994).

Castillo, E.D. et al., "Run–to–Run Process Control: Literature Review and Extensions", Journal of Quality Technology, 29(2):184–196 (Apr. 1997).

Hunter, J.S. "The Exponentially Weighted Moving Average", Journal of Quality Technology, 18(4):203–210 (Oct. 1986).

Ingolfsson, A. et al., "Stability and Sensitivity of an EWMA Controller", Journal of Quality Technology, 25(4):271–287 (Oct. 1993).

(List continued on next page.)

Primary Examiner—Thomas M. Heckler
(74) Attorney, Agent, or Firm—Crawford PLLC

(57) ABSTRACT

A system and method for controlling the manufacture of semiconductor wafers using model predictive control is provided. In accordance with one embodiment, a tool output of the manufacturing tool is determined based on a first wafer run. Using the tool output, a tool input for a subsequent wafer run is determined by minimizing an optimization equation being dependent upon a model which relates tool output to tool process state and tool process state to tool input and previous tool process state. The tool input is then provided to the manufacturing tool for processing a second wafer run. In this manner, processing by the tool or tool age is taken into account in determining the tool input for a subsequent run. This can reduce variations in tool output from run-to-run and improve the characteristics of the ultimately formed semiconductor devices. The tool may, for example, be a chemical mechanical polishing tool with the tool input being polishing time and the tool output being a post-polish wafer layer thickness associated with CMP tool for a run.

41 Claims, 3 Drawing Sheets

OTHER PUBLICATIONS

MacGregor, J.F., "On–Line Statistical Process Control", *Chemical Engineering Progress,* pp. 21–31 (Oct. 1988).

Martinez, M.A., "Chemical–mechanical polishing: Route to global planarization", *Solic State Technology,* pp. 26–31 (May 1994).

Montgomery, D.C. et al., "Integrating Statistical Process Control and Engineering Process Control", *Journal of Quality Technology,* 26(2):79–87 (Apr. 1994).

Muske, K.R. et al., "Model Predictive Control with Linear Models", *AIChE Journal,* 39(2):262–287 (Feb. 1993).

Muske, K.R. *Linear Model Predictive Control of Chemical Processes,* UMI Dissertation Services, pp 1–170, Copyright 1995.

Muth, J.F., "Optimal Properties of Exponentially Weighted Forecasts", *Journal of the American Statistical Association,* 55(290):299–306 (Jun. 1960).

Nanz, G. et al., "Modeling of Chemical–Mechanical Polishing: A Review", *IEEE Transactions on Semiconductor Manufacturing,* 8(4):382–389 (Nov. 1995).

Sachs, E. et al., "Modeling and Control of an Epitaxial Silicon Deposition Process with Step Disturbances", IEEE/SEMI Advanced Semiconductor Manufacturing Conference and Workshop, ASMC '91 Proceedings, Boston, Massachusetts, pp. 104–107 (Oct. 21–23, 1991).

Sachs, E. et al., "Run by Run Process Control: Combining SPC and Feedback Control", *IEEE Transactions on Semiconductor Manufacturing,* 8(1):26–43 (Feb. 1995).

Telfeyan, R. et al., "A multilevel approach to the control of a chemical–mechanical planarization process", *J. Vac. Sci. Technol. A,* 14(3):1907–1913 (May/Jun. 1996).

Warnock, J., "A Two–Dimensional Process Model for Chemimechanical Polish Planarization", *J. Electrochem. Soc.,* 138(8):2398–2402 (Aug. 1991).-

SYSTEM AND METHOD FOR CONTROLLING THE MANUFACTURE OF DISCRETE PARTS IN SEMICONDUCTOR FABRICATION USING MODEL PREDICTIVE CONTROL

The United States Government has a paid-up license in this invention and the right in limited circumstances to require the patent owner to license others on reasonable terms as provided for by the terms of Award No. 70NANB6H2002 awarded by the U.S. Department of Commerce, National Institute of Standards and Technology.

FIELD OF THE INVENTION

The present invention relates generally to the manufacture of discrete parts using model predictive control, more specifically, to a system and method for controlling the manufacture of semiconductor wafers using model predictive control.

BACKGROUND OF THE INVENTION

Many manufacturing operations involve the manufacture of discrete parts. Semiconductor fabrication includes the fabrication of discrete parts, such as runs or batches of wafers, each of which includes one or more wafers fabricated using similar processing. One challenge in semiconductor fabrication is controlling equipment inputs from run to run. The challenge in run-to-run control stems from a lack of real-time information about process states and output states while processing a given wafer or group of wafers and variable input states of incoming wafers.

Chemical-mechanical polishing (CMP) is a common and rapidly growing process used in the fabrication of semiconductor wafers for planarizing silicon dioxide as well as other types of layers on semiconductor wafers. Chemical mechanical polishing typically utilizes an abrasive slurry disbursed in an alkaline or acidic solution to planarize the surface of the wafer through a combination of mechanical and chemical action. A typical chemical mechanical polishing tool includes a rotatable circular platen or table on which a polishing pad is mounted and a polishing device is positioned above the pad. The polishing device includes one or more rotating carrier heads to which wafers can be secured typically through the use of vacuum pressure. In use, the platen is rotated and an abrasive slurry is disbursed onto the polishing pad. Once the slurry has been applied to the polishing pad, a downforce is applied to each rotating carrier head to press its wafer against the polishing pad. As the wafer is pressed against the polishing pad, the surface of the wafer is mechanically and chemically polished. In a manufacturing operation, the usual adjustment parameter or tool input is polishing time (though in some operations, carrier downforce is input as well). Other parameters, such as table speed and carrier downforces are fixed for the process.

As semiconductor devices are scaled down, the importance of run-to-run control increases. In particular, it becomes increasingly important to control tool outputs as variations in tool outputs deleteriously impact subsequent fabrication steps and degrade device performance. In CMP, for example, tool outputs, such as post-polish thicknesses of polished layers, must be accurately controlled as variations in post-polish thicknesses can, for example, significantly degrade subsequent processing steps, such as lithography.

Conventional run-to-run control of manufacturing tools, such as CMP tools, typically involves the use of Exponentially Weighted Moving Average (EWMA) controllers. EWMA controllers typically use a linear regression process model such as:

$$y_k = B^* u_{k|k-1} + c_{k|k-1} + e_k \quad [1]$$

Where $y_k$ is the output at batch k, B is the process gain, $u_{k|k-1}$ is the input at batch k calculated from information up through batch k–1, $c_{k|k-1}$ is the estimate for the intercept, and $e_k$ is unknown process noise entering the system. Typically, the system gain and the initial value of the intercept is modeled a priori from designed experiments.

The intercept is typically updated recursively by an observer of the form:

$$c_{k|k-1} = \lambda^*(y_{k-1} - B^* u_{k-1|k-2}) + (1-\lambda)^* c_{k-1|k-2} \quad [2]$$

where $\lambda$ is the exponential weighting factor, or tuning parameter, of the observer. The weighting factor $\lambda$ takes a value between 0 and 1 and is chosen based on the desired properties of the observer. Using the updated intercept, the input for batch k ($u_{k|k-1}$) is determined from the following relationship:

$$u_{k|k-1} = (T - c_{k|k-1})/B \quad [3]$$

where T is a target output thickness.

Other controllers, such as predictor-corrector controllers (PCC), have been suggested for run-to-run control. PCC uses a second exponential filter to forecast the trend in the estimated intercept in an attempt to predict how the intercept will change in the future, while the standard EWMA controller simply assumes the intercept will remain constant. The additional observer equation of the PCC is of the form:

$$\delta c_{k|k-1} = \gamma^*(y_k - B^* u_{k|k-1} - c_{k|k-1}) + (1-\gamma)^* \delta c_{k-1|k-2} \quad [4]$$

where $\delta c_{k|k-1}$ is the smoothed trend of the intercept. After this modification, the model prediction equation then becomes:

$$y_k = B^* u_{k|k-1} + c_{k|k-1} \quad [5]$$

with the new prediction for the intercept given by:

$$c_{k|k-1} = c_{k|k-1} + \delta c_{k|k-1} \quad [6]$$

Despite the use of EWMA and PCC controllers, variations in tool output still significantly impact semiconductor fabrication and device performance. The significance of the impact is also growing as a result of the ever decreasing size of semiconductor devices. Consequently, semiconductor manufacturers seek systems and methods for more accurately controlling the manufacture of semiconductor wafers.

SUMMARY OF THE INVENTION

The present invention provides a system and method for controlling the manufacture of semiconductor wafers using model predictive control. In accordance with one embodiment, a tool output of the manufacturing tool is determined based on a first wafer run. Using the tool output, a tool input for a subsequent wafer run is determined by minimizing an optimization equation being dependent upon a model which relates tool output to tool process state and tool process state to tool input and previous tool process state. The tool input is then provided to the manufacturing tool for processing a second wafer run. In this manner, processing by the tool or tool age is taken into account in determining the tool input for a subsequent run. This can reduce variations in tool output from run-to-run and improve the characteristics of the ultimately formed semiconductor devices. The tool may, for example, be a chemical mechanical polishing tool with the tool input being polishing time and the tool output being a post-polish wafer layer thickness associated with CMP tool for a run.

The above summary of the present invention is not intended to describe each illustrated embodiment or implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
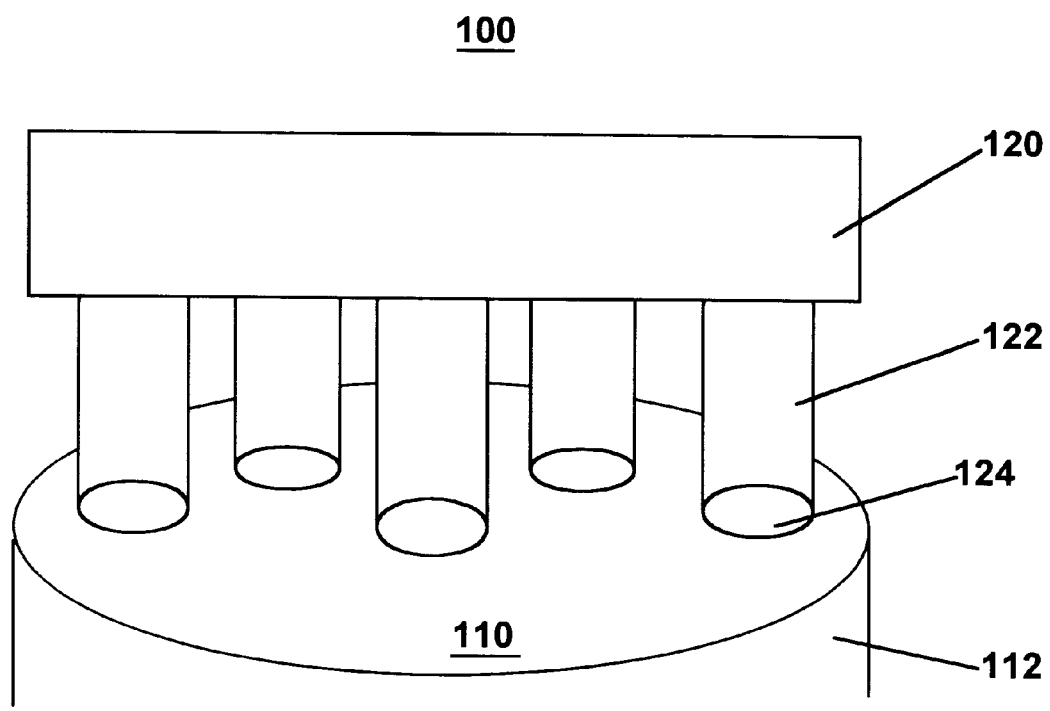
FIG. 1 illustrates a conventional polishing tool having multiple polishing arms.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention generally provides a system and method for run-to-run control of the manufacture of semiconductor wafers using model predictive control. The invention is particularly suited for controlling post-polish thicknesses of wafer layers, such as dielectric layers, by chemical mechanical polishing (CMP) tools. While the invention is not so limited, a more thorough understanding of the invention will be achieved by reading the detailed description which follows.

FIG. 1 illustrates, by way of example, a polishing tool which may be used with the present invention. The exemplary polishing tool 100 generally includes a polishing pad 110 mounted on a platen 112 and a multi-head carrier 120 positioned above the polishing pad 110. The multi-head carrier 120 typically includes a plurality of rotatable polishing arms 122, each of which includes a head 124. Wafers can be secured to the carrier heads 124 by known techniques such as vacuum pressure. A source of polishing fluid (not shown) is also provided to supply polishing fluid to the pad 110 for polishing. It should be appreciated that the polishing tool 100 is illustrated by way of example only. Other polishing tools having one or more polishing arms may be used with the present invention.

Figure 2:
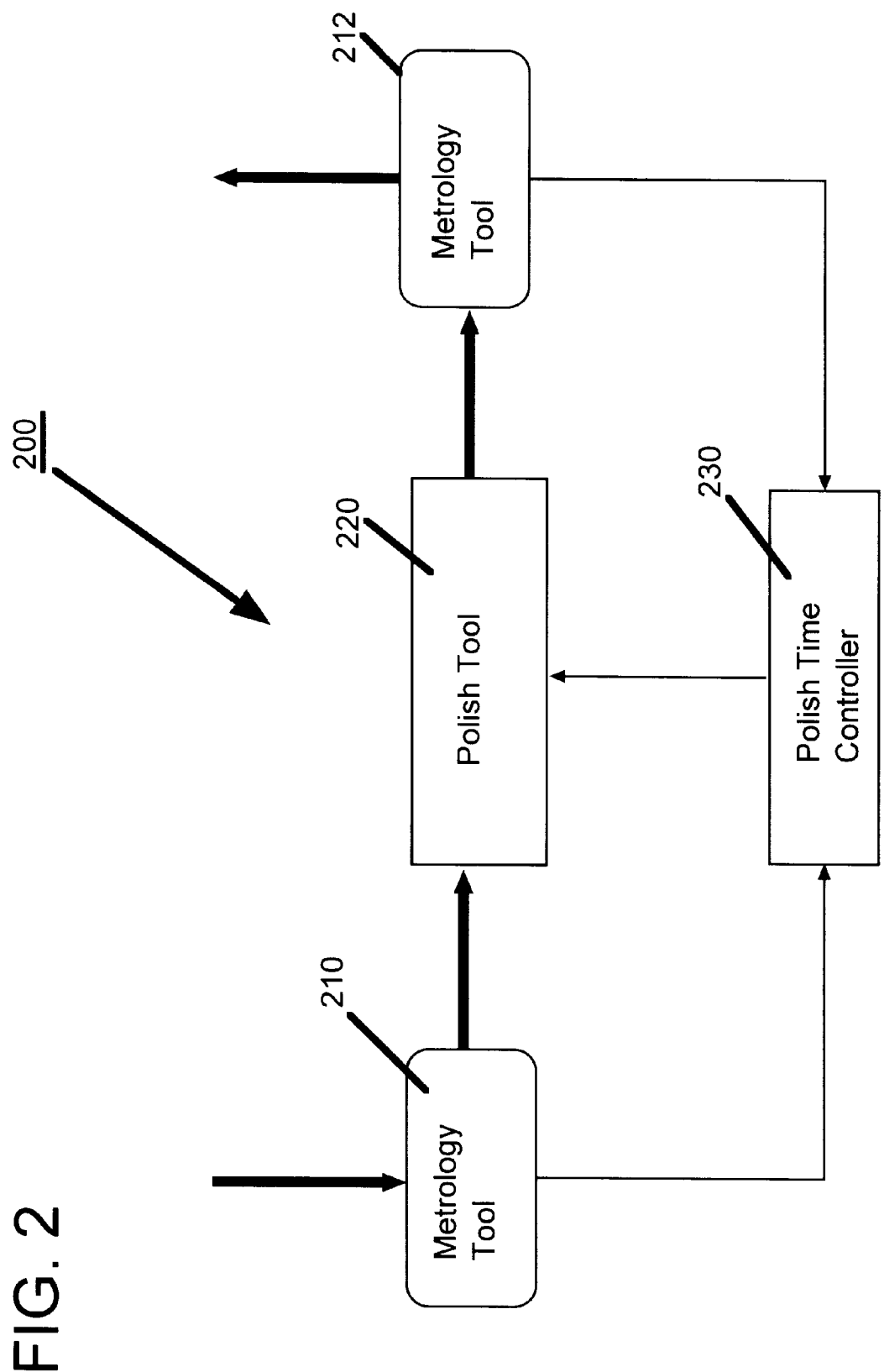
FIG. 2 illustrates exemplary control system for a polishing tool in accordance with one embodiment of the invention.

FIG. 2 illustrates an exemplary control system for controlling a polishing tool, such as the one described above, in accordance with one embodiment of the invention. The exemplary control system 200 includes two metrology tools 210 and 212 for measuring pre-polish thicknesses and post-polish thicknesses of wafer layers (e.g., dielectric layers), respectively. It should be appreciated that while two metrology tools are illustrated, a single metrology tool may be used to perform both pre- and post-polish thickness measurements. The two metrology tools 210 and 212 are coupled to a polish tool 220. A suitable metrology tool for many applications is the Optiprobe metrology tool by Thermawave.

The system further includes a controller 230 coupled to the polishing tool 220 for controlling the inputs, such as polishing time to the polishing tool 220. The controller 230 generally receives pre- and post-polish thickness measurements from the metrology tools 210 and 212 for a wafer run and uses the thickness measurements to control a polishing time input to the polish tool 220 for a subsequent wafer run. The polishing time input may, for example, be a deviation from a nominal polishing time. The controller may, for example, be a model predictive controller implemented using, for example, MatLab Optimization Toolbox® routines. The controller 230 may be interfaced with the polish tool 220 using, for example, an Advance Process Control Framework interface.

Figure 3:
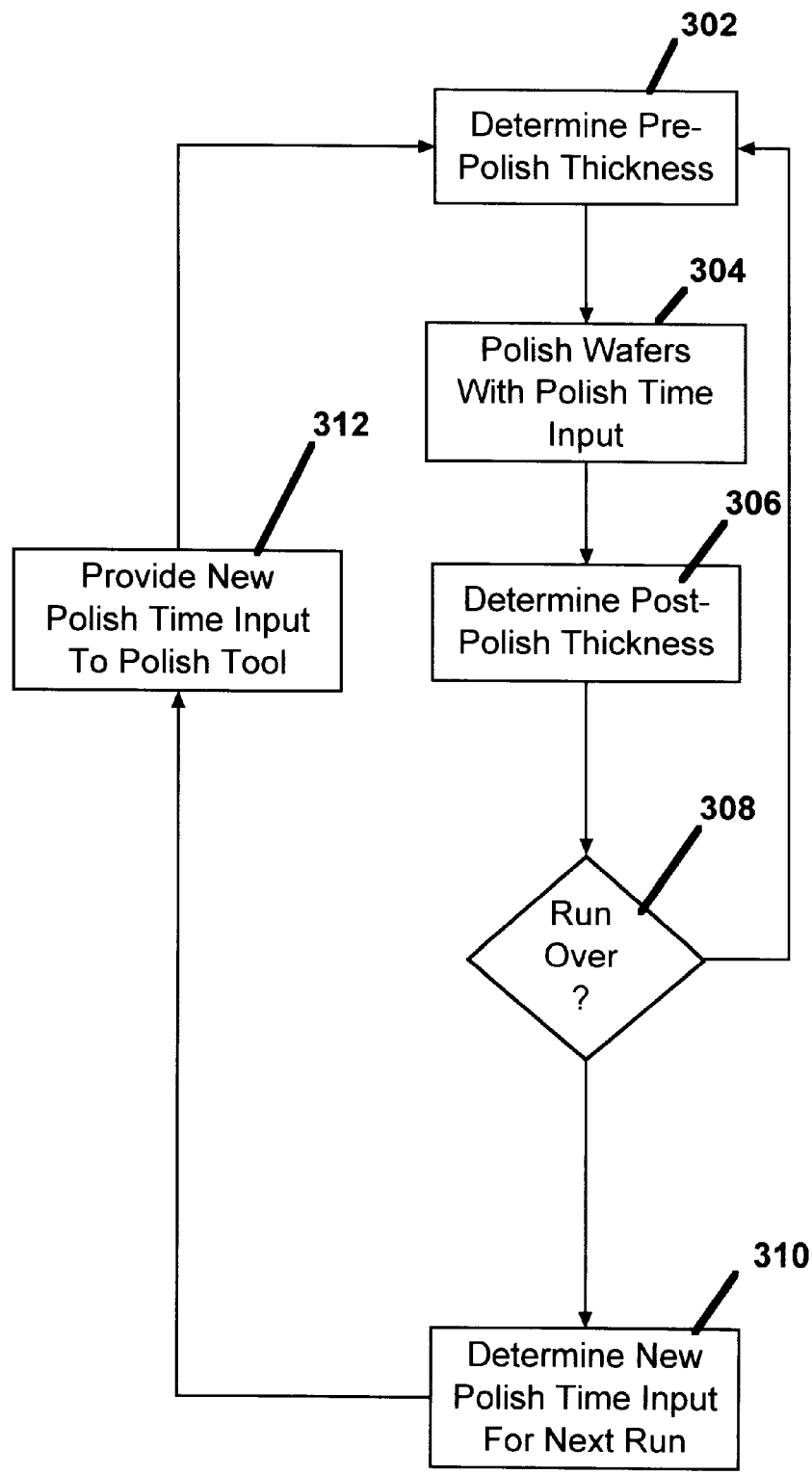
FIG. 3 is a flow chart illustrating an exemplary process for controlling a polishing tool in accordance with one embodiment of the invention.

An exemplary process flow for the system 200 is illustrated in FIG. 3. At block 302, a first wafer group (e.g., one or more wafers depending on the number of polishing arms) is provided to the metrology tool 210 for measuring a pre-polish thickness of each wafer layer to be polished. Each pre-polish thickness is then stored, typically in a database accessible by the controller 230. The wafer group is then loaded onto the carrier head(s) of the tool's polishing arm(s) and the wafer group is polished using a predetermined polishing time to remove at least part of the wafer layer of each wafer, as indicated at block 304. The polishing time may be either calculated by the controller 230 at block 310 (as will be discussed below) or, for an initial run, predefined by an operator. The polishing is typically performed at a predetermined table speed with predetermined downforces on each arm. The controller 230 may, however, be used to determine the downforces on each arm if desired. Techniques for controlling the downforces on the polishing arms of a multi-arm polishing tool are described in the co-pending and commonly assigned U.S. Pat. No. 6,171,174, issued Jan. 9, 2000, entitled "SYSTEM AND METHOD FOR CONTROLLING A MULTI-ARM POLISHING TOOL," U.S. patent application Ser. No. 09/105,980, filed on Jun. 26, 1998, the contents of which are herein incorporated by reference.

After polishing the wafer group, the post-polish thickness of the polished layer of each wafer is determined by metrology tool 212, as indicated at block 306. The post-polish thickness for each wafer is typically stored in the database accessible by the controller 230. At block 308, the controller 230 determines whether the wafer run has finished. If not, control moves to block 302 and another wafer group is polished using the same polishing time input. If the run has finished, control moves to block 310 where a new polishing time input (which will be applied to a subsequent wafer run) is determined by the controller 230. Typically, the controller 230 determines the new polishing time input for the polishing tool 220 by solving an optimization equation based on a model which includes a predetermined relationship between predicted removal amount and current removal amount. Details of exemplary process model and optimization equation which may be used by the controller 230 are discussed below. Control then moves to block 312 where the new polishing time input is provided to the polish tool 220. Another wafer run is then polished using the new polishing time inputs determined by the controller 230 at block 310.

As noted above, the new polishing time input is determined by solving an optimization equation based on a process model. An exemplary process model for a polish tool, suitable for many applications, is:

$$z_{k+1} = a z_k + b u_k + w_k \quad [7]$$

where $z_{k+1}$ is a predicted amount of material removed at run k+1, $z_k$ is a the amount of material removed at run k+1, $u_k$ represents the polishing time input (e.g., a polish time or deviation from a nominal polishing time), $w_k$ represents process noise, a accounts for any tendency for the process to change over time or drift, and b relates the polishing time input to the amount of material removed. The use of the term $a z_k$ advantageously takes process dynamics, such as tool drift resulting from pad degradation, into account and allows the polishing time input to be determined based on such process dynamics. The fixed coefficient a may be view as a memory effect coefficient which takes into account the effects of one polish process on future polish processes.

The values of a and b as well as noise $w_k$ are process dependent. For instance, with a polishing tool, a and b can vary depending on the type of polishing tool, the table speed, the arm downforces, the slurry and the topography of the wafer being polished. Typically, the coefficients a and b and noise $w_k$ are determined experimentally for a given polishing tool using test wafers. Suitable experimental techniques include well-known design of experiment (DOE) or pseudo-random binary sequence system identification techniques. By way of example and not of limitation, for many polishing applications, suitable values for a range from −1 to 1, while suitable values of b range from 40 to 250 Angstroms/second. The noise $w_k$ is typically a random variable normally distributed, e.g., at about 5–10% of target output thickness.

The exemplary process model may further include a feed forward model which accounts for upstream variations in a process, such as pre-polish layer thicknesses between runs. For example, in a typical fabrication facility, the deposition and polishing steps are not tightly coupled and a polishing tool typically receives wafers from several different deposition tools. As a result, the pre-polish thickness of wafers typically (and often, substantially) varies from run-to-run. A suitable feed forward model for many applications would be:

$$f_{k+1} = \alpha f_k \quad [8]$$

where $f_{k+1}$ is a predicted incoming thickness at run k+1 and $f_k$ is the incoming thickness on run k. Typically, the incoming thickness level $f_k$ is an average of the incoming thickness of the wafer(s) processed at run k. The factor a accounts for drift in the upstream process (e.g., drift in a deposition tool). For many applications α may equal 1 (one), signifying that the best estimate of the next incoming thickness $f_{k+1}$ is the last incoming thickness $f_k$. The use of such a measured feed forward disturbance model can further enhance controller performance.

The exemplary process model may further include an unknown state disturbance model which accounts for unknown state disturbances, such as slurry changes, pad changes, etc., between runs. A suitable unknown state disturbance model for many applications would be:

$$d_{k+1} = \beta d_k \quad [9]$$

where $d_{k+1}$ and $d_k$ are unknown disturbances at runs k+1 and k, respectively, Typically, the unknown disturbance level for the tool at run k ($d_k$) is the difference between the expected post-polish thickness level for run k and the measured post-polish thickness level. The value $d_k$ may also be filtered if desired. The factor β may be used to account for drift in the unknown disturbance. For many applications β may equal 1 (one), signifying that the best estimate of the next incoming unknown disturbance $d_{k+1}$ is the last unknown disturbance $d_k$. The use of such an unknown disturbance model can further enhance controller performance.

An exemplary process model of the system, which uses both a feed forward model and an unknown disturbance model is:

$$z_{k+1} = a z_k + b u_k + f_k + d_k + w_k$$

$$f_{k+1} = f_k$$

$$d_{k+1} = d_k \quad [10]$$

The output, post-polish thickness $y_k$, of the system is modeled by:

$$y_k = \begin{bmatrix} -1 & 1 & 1 \end{bmatrix} \begin{pmatrix} z_k \\ f_k \\ d_k \end{pmatrix} \quad [11]$$

The output model may be modified to account for time delay in the feedback of the metrology tools by virtue of the time needed to measure layer thicknesses. One suitable output model includes a time delay of 2 units (i.e., 2 runs) and is as follows.

$$y_k = \begin{bmatrix} 0 & 0 & -1 & 0 & 0 & 1 & 0 & 0 & 1 \end{bmatrix} \begin{pmatrix} z_k \\ z_{k-1} \\ z_{k-2} \\ f_k \\ f_{k-1} \\ f_{k-2} \\ d_k \\ d_{k-1} \\ d_{k-2} \end{pmatrix} \quad [12]$$

An exemplary optimization equation for controller may be:

$$\min_{u^N} \sum_{j=0}^{\infty} (y_{k+j+1} - y_T)^T Q (y_{k+j+1} - y_T) + u_{k+j}^T R u_{k+j} + \Delta u_{k+j}^T S \Delta u_{k+j} \quad [13]$$

subject to Equations [10] and [11] above. Where $y_T$ is a target output, Q is the weight on the output error (the difference between post-polish thickness at run k+j+1 and target post-polish thickness $y_T$), S is the weight on the rate of change of the inputs $\Delta u_{k+j}$, and R is the weight on the inputs $u_{k+j}$, and $u^N$ is the sequence of N input moves computed as the solution to equation [3]. N is suitably selected based on the number of runs which the controller is desired to look ahead when computing a solution at run k. In certain embodiments, the controller may be simplified by using a sequence of future moves N of one (1). In such cases, the optimization equation reduces to:

$$\min_{u^N} (y_{k+1} - y_T)^T Q (y_{k+1} - y_T) + u_k^T R u_k + \Delta u_k^T S \Delta u_k \quad [14]$$

subject to Equations [10] and [11] above. The weights Q, R (if appropriate) and S may be suitably selected based on the desired weighting of the respective functions (i.e., the output errors, the inputs, and the rate of change of the inputs). This allows control of the polish tool to be tuned for a desired performance. For example, performance such as minimizing output deviations from target or minimizing changes in polishing time can be tuned by varying weights Q and S. The optimization equation (e.g., equation 13 or 14 above) of the controller 230 may be solved for the input, polishing time $u_k$, which minimizes the optimization equation over a predetermined sequence of inputs N.

The optimization equation may further be solved for the polishing time which minimizes the optimization equation (e.g., equation 13 or 14 above) over N future runs taking into account constraints on the polishing tool. The constraints are typically dictated by processing considerations and may include, for example, requiring polishing time input to be less than a certain value (e.g., $u_k < \text{time}_{max}$) or that change in polishing time inputs between runs must lie between an upper bound and a lower bound (e.g., $B_L < u_{k+1} - u_k < B_u$).

In operation, the controller 230, at block 310, determines a post-polish thickness level $y_k$, and a pre-polish thickness level $f_k$ for the tool for the current run (run k). For multiple wafers, the pre-polish and post-polish thicknesses $f_k$ and $y_k$ of the tool may be the averaged pre- and post-polish thickness for the wafer(s) polished during run k. For models using an unknown disturbance model, an unknown disturbance value $d_k$ for the tool is also determined. The value $d_k$ for the tool at run k may be the difference between an expected post-polishing thickness for run k and the measured post-polish thickness level at run k. Using the measured pre- and post-polish thickness levels $f_k$ and $y_k$ (and, in desired cases, the unknown disturbance, $d_k$), the controller 230 then solves an optimization equation (e.g., equation 13 or 14 above) for a new polishing time $u_k$ (to be applied during the next run, run k+1) which minimizes the optimization equation subject to any constraints over the predetermined future inputs N.

Using the above control system, run-to-run variations in post polish thickness can be reduced as compared to conventional control techniques (such as EWMA or PCC techniques). The above control system reduces such run-to-run variations by, for example, taking into account drift of the process in determining future process output and inputs. In particular a fixed amount of drift (a in equation [7]) is incorporated into the controller for more accurately controlling the polishing tool. Further reductions in run-to-run variations may be provided by incorporating measured feed forward disturbance (e.g., thickness disturbance) and unknown disturbance models into the process model and controller's optimization equation.

While the above exemplary embodiments illustrate the run-to-run control of polishing tools, such as CMP tools, it is stressed that the present invention is not limited to the control of polishing tools, but extends to cover any manufacturing tool used in run-to-run manufacturing. Other systems or tools, to which the present invention is applicable include, for example, deposition tools, such as chemical-vapor deposition (CVD) tools and sputter deposition tools. For instance, with CVD deposition tools, the tool output may be deposition layer thickness, while the process state may be chamber cleanliness. With sputter deposition tools, the tool output may be deposition layer thickness, while the process state may be target age or cleanliness.

As noted above, the present invention is applicable to run-to-run control of a number of different manufacturing tools. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A method for run-to-run control of a semiconductor manufacturing tool in a semiconductor fabrication facility wherein the tool has a plurality of process states respectively corresponding to stages of wafer handling during wafer manufacture, a tool output is a parameter characterizing a process state result, and a tool input is a parameter characterizing a control aspect of a process state, the method comprising:

determining a tool output of the semiconductor manufacturing tool based on a first wafer run;

determining a tool input for the semiconductor manufacturing tool for a subsequent wafer run by minimizing an optimization equation using the tool output, the optimization equation being dependent upon a model which relates tool output to tool process state and tool process state to tool input and previous tool process state; and providing the tool input to the manufacturing tool for processing the subsequent wafer run.

2. The method of claim 1, wherein determining the tool input includes minimizing the optimization equation over one or more future runs.

3. The method of claim 2, wherein determining the tool input includes minimizing the optimization equation over two or more future runs.

4. The method of claim 2, wherein the optimization equation is a function of tool output.

5. The method of claim 4, wherein the optimization equation is a function of a rate of change of tool input.

6. The method of claim 5, wherein the optimization equation is a function of tool input.

7. The method of claim 5, wherein the optimization equation includes weighting coefficients for tool output and the rate of change of tool input.

8. The method of claim 2, wherein minimizing the optimization equation includes minimizing the optimization equation subject to one or more constraints.

9. The method of claim 1, wherein determining the tool output includes averaging an individual tool output for each wafer in the first run.

10. The method of claim 1, wherein the model includes the relationship:

$$z_{k+1} = f(az_k, bu_k)$$

where $z_{k+1}$ represents a predicted tool process state for a run k+1, $z_k$ represents a measured tool process state at a run k, $u_k$ represents an input value for run k, coefficient a represents a fixed coefficient associated with tool drift and coefficient b represents a coefficient relating tool input $u_k$ to tool process state $z_{k+1}$.

11. The method of claim 10, wherein the model further includes a feed forward disturbance model.

12. The method of claim 10, wherein the model further includes an unknown state disturbance model.

13. The method of claim 10, wherein the model further includes an output model.

14. The method of claim 13, wherein the output model includes time delay.

15. The method of claim 1, wherein the semiconductor manufacturing tool is a polishing tool, the tool output represents a post-polish wafer layer thickness level, the tool input represents a polishing time, and the tool process state represents a removal amount level.

16. A run-to-run controller for controlling a semiconductor manufacturing tool wherein the tool has a plurality of process states respectively corresponding to stages of wafer handling during wafer manufacture, a tool output is a parameter characterizing a process state result, and a tool input is a parameter characterizing a control aspect of a process state, comprising:

means for determining a tool output of the semiconductor manufacturing tool based on a first wafer run;

means for determining a tool input for the semiconductor manufacturing tool for a subsequent wafer run by minimizing an optimization equation using the tool output, the optimization equation being dependent upon a model which relates tool output to tool process state and tool process state to tool input and previous tool process state; and means for providing the tool input to the manufacturing tool for processing the subsequent wafer run.

17. The controller of claim 16, wherein means for determining the tool input includes means for minimizing the optimization equation over one or more future runs.

18. The controller of claim 17, wherein means for determining the tool input includes means for minimizing the optimization equation over two or more future runs.

19. The controller of claim 17, wherein the optimization equation is a weighted function of tool output.

20. The controller of claim 19, wherein the optimization equation is weighted function of a rate of change of tool input.

21. The controller of claim 20, wherein the optimization equation is a weighted function of tool input.

22. The controller of claim 17, wherein means for minimizing the optimization equation includes means for minimizing the optimization equation subject to one or more constraints.

23. The controller of claim 16, wherein means for determining the tool output includes means for averaging an individual tool output for each wafer in the first run.

24. The controller of claim 16, wherein the model includes the relationship:

$$z_{k+1}=f(az_k,bu_k)$$

where $z_{k+1}$ represents a predicted tool process state for a run k+1, $z_k$ represents a measured tool process state at a run k, $u_k$ represents an input value for run k, coefficient a represents a fixed coefficient associated with tool drift and coefficient b represents a coefficient relating tool input $u_k$ to tool process state $z_{k+1}$.

25. The controller of claim 24, wherein the model further includes a feed forward disturbance model.

26. The controller of claim 24, wherein the model further includes an unknown state disturbance model.

27. The controller of claim 24, wherein the model further includes an output model.

28. The controller of claim 16, wherein the semiconductor manufacturing tool is a polishing tool, the tool output represents a post-polish wafer layer thickness level, the tool input represents a polishing time, and the tool process state represents a removal amount level.

29. A polishing system, comprising:

a polishing tool;

one or more metrology tools, connected to the polishing tool, for measuring pre-polish thicknesses and post-polish thicknesses of layers on wafers;

a run-to-run controller coupled to the polishing tool and the one or more measuring tools configured to;

determine a post-polish thickness associated with the polishing tool for a first wafer run;

determine a pre-polish thickness associated with the polishing tool for the first wafer run;

determine a polishing time input for the polish tool for a subsequent wafer run by minimizing an optimization equation using the post-polish thickness and the pre-polish thickness, the optimization equation being dependent upon a model which relates post-polish thickness to removal amount and which relates removal amount to a previous removal amount; and provide the polishing time input to the manufacturing tool for processing the subsequent wafer run.

30. The polishing system of claim 29, wherein the controller determines the tool input by minimizing the optimization equation over one or more future runs.

31. The polishing system of claim 29, wherein the controller determines the tool input by minimizing the optimization equation over two or more runs.

32. The polishing system of claim 29, wherein the optimization equation is function of tool output.

33. The polishing system of claim 32, wherein the optimization equation is function of a rate of change of tool input.

34. The polishing system of claim 33, wherein the optimization equation is function of tool input.

35. The polishing system of claim 33, wherein the optimization equation includes weighting coefficients for tool output and the rate of change of tool input.

36. The polishing system of claim 30, wherein the controller minimizes the optimization equation subject to one or more constraints.

37. The polishing system of claim 29, wherein the controller determines the tool output by averaging an individual tool output for each wafer in the first run.

38. The polishing system of claim 29, wherein the tool has a plurality of process states respectively corresponding to stages of wafer handling during wafer manufacture, a tool output is a parameter characterizing a process state result, and a tool input is a parameter characterizing a control aspect of a process state and wherein the model includes the relationship:

$$z_{k+1}=f(az_k,bu_k)$$

where $z_{k+1}$ represents a predicted tool process state for a run k+1, $z_k$ represents a measured tool process state at a run k, $u_k$ represents an input value for run k, coefficient a represents a fixed coefficient associated with tool drift and coefficient b represents a coefficient relating tool input $u_k$ to tool process state $z_{k+1}$.

39. The polishing system of claim 38, wherein the model further includes a feed forward disturbance model.

40. The polishing system of claim 38, wherein the model further includes an unknown state disturbance model.

41. The polishing system of claim 38, wherein the model further includes an output model.

\* \* \* \* \*

UNITED STATES PATENT AND TRADEMARK OFFICE
CERTIFICATE OF CORRECTION

PATENT NO. : 6,230,069 B1  
DATED : May 8, 2001  
INVENTOR(S) : Campbell et al.

It is certified that error appears in the above-identified patent and that said Letters Patent is hereby corrected as shown below:

Column 5,  
Line 17, "view" should read -- viewed --.

Column 10,  
Lines 27, 29, and 32 "is function" should read -- is a function --.  
Line 50, "$z_{k+}1=f(az_k,bu_k)$" should read -- $z_{k+1}=f(az_k,bu_k)$ --.

Signed and Sealed this

Fourth Day of March, 2003

JAMES E. ROGAN  
*Director of the United States Patent and Trademark Office*